(12) United States Patent
Kannengiesser et al.

(10) Patent No.: US 9,971,006 B2
(45) Date of Patent: May 15, 2018

(54) MAGNETIC RESONANCE METHOD AND APPARATUS TO GENERATE A RESIDUAL MAP AS AN INDICATOR OF SIGNAL MODEL CONSISTENCY

(71) Applicant: Siemens Aktiengesellschaft, Munich (DE)

(72) Inventors: Stephan Kannengiesser, Wuppertal (DE); Marcel Dominik Nickel, Herzogenaurach (DE); Xiaodong Zhong, Lilburn, GA (US)

(73) Assignee: Siemens Healthcare GmbH, Erlangen (DE)

( * ) Notice: Subject to any disclaimer, the term of this patent is extended or adjusted under 35 U.S.C. 154(b) by 454 days.

(21) Appl. No.: 14/724,999

(22) Filed: May 29, 2015

(65) Prior Publication Data

US 2016/0282433 A1 Sep. 29, 2016

Related U.S. Application Data

(60) Provisional application No. 62/138,068, filed on Mar. 25, 2015.

(51) Int. Cl.
*G01V 3/00* (2006.01)
*G01R 33/48* (2006.01)
(Continued)

(52) U.S. Cl.
CPC .......... *G01R 33/4828* (2013.01); *G01R 33/50* (2013.01); *G01R 33/5608* (2013.01)

(58) Field of Classification Search
CPC .............. G01R 33/34; G01R 33/34007; G01R 33/3635; G01R 33/48; G01R 33/4818;
(Continued)

(56) References Cited

U.S. PATENT DOCUMENTS 5,378,987 A    1/1995   Ishihara et al.
8,755,582 B2 *   6/2014   Kimmlingen ........ G01R 33/243
                                                                                                                      382/131
(Continued)

OTHER PUBLICATIONS

Hernando, et al. "Chemical Shift-Based Water/Fat Separation: A Comparison of Signal Models," Magnetic Resonance in Medicine, vol. 64, pp. 811-822 (2010).
(Continued)

*Primary Examiner* — Thang Le
(74) *Attorney, Agent, or Firm* — Schiff Hardin LLP (57) ABSTRACT

In a magnetic resonance (MR) apparatus and a method for operating an MR apparatus, MR data are acquired and evaluated with regard to multiple tentative signal models for producing a parameter map based on one of those signal models. The parameter map shows multiple parameters that have respective effects on the MR data. Each tentative signal model is initially analyzed to determine whether any of the parameters used therein can be assumed to be at least locally constant, and the initially analyzed tentative signal model is then subjected at least to a quality of fit analysis. The tentative signal model having at least the best quality of fit analysis result is then used to generate a parameter map that is displayed at a display monitor.

10 Claims, 5 Drawing Sheets

(51) Int. Cl.
*G01R 33/56* (2006.01)
*G01R 33/50* (2006.01)

(58) Field of Classification Search
CPC .......... G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341; G01R 33/385; G01R 33/56358; A61B 5/055; A61B 5/0555; A61B 5/7278; A61B 5/725
USPC .................................................. 324/300–322
See application file for complete search history.

(56) References Cited

U.S. PATENT DOCUMENTS

| | | | | |
|---|---|---|---|---|
| 2009/0273343 | A1* | 11/2009 | Borthakur | A61B 5/055 324/307 |
| 2014/0126795 | A1 | 5/2014 | Zhong et al. | |
| 2014/0233817 | A1* | 8/2014 | Hernando | G01R 33/4828 382/131 |
| 2015/0061672 | A1 | 3/2015 | Kannengiesser et al. | |
| 2015/0285879 | A1* | 10/2015 | Hilbert | G01R 33/50 324/309 |
| 2015/0287222 | A1* | 10/2015 | Zhao | G01R 33/50 382/131 |
| 2016/0270687 | A1* | 9/2016 | Brady-Kalnay | A61B 5/055 |
| 2016/0292855 | A1* | 10/2016 | Metzger | G06T 7/0012 |
| 2017/0039708 | A1* | 2/2017 | Henry | A61B 5/055 |

OTHER PUBLICATIONS

Bacher, et al; "Signal Model Consistency Analysis of Different Protocols and Spectral Models in Multi Gradient Echo Liver PDFF and R2 Quantification"; Proc. Intl. Soc. Mag. Reson. Med.; vol. 22; p. 1672; (2014).

* cited by examiner

MAGNETIC RESONANCE METHOD AND APPARATUS TO GENERATE A RESIDUAL MAP AS AN INDICATOR OF SIGNAL MODEL CONSISTENCY

RELATED APPLICATION

The present application claims the benefit of the filing date of Provisional Application 62/138,068, filed on Mar. 25, 2015.

BACKGROUND OF THE INVENTION

Field of the Invention

The present invention concerns magnetic resonance imaging, and in particular a method and apparatus for magnetic resonance imaging wherein a signal model is used to generate a quantitative parameter map.

Description of the Prior Art

Magnetic resonance (MR) is a known modality with which images of the inside of an examination subject can be generated. Such a procedure is known as magnetic resonance imaging, or magnetic resonance tomography.

In simple terms, an examination subject is situated in a magnetic resonance apparatus in which a strong, static, homogenous basic magnetic field (also called a $B_0$ field) is generated, having a field strength of 1.5 T Tesla, or more, which causes nuclear spins in the subject to become oriented along the direction of the basic magnetic field. Radio-frequency (RF) excitation pulses are radiated into the examination subject, which trigger the emission of nuclear magnetic resonance signals by the nuclear spins. These magnetic resonance signals are detected and are entered into a memory that is organized as k-space. The k-space data in the memory are used to reconstruct an image of the subject.

During the acquisition of the magnetic resonance signals, rapidly activated magnetic gradient fields are superimposed on the basic magnetic field, which spatially code the measurement data. These magnetic field gradients determine the points in the k-space memory at which the measurement data are entered. The acquired measurement data are digitized and stored as complex numerical values in k-space. An MR image can be reconstructed from k-space populated with such values by, for example, a multi-dimensional Fourier transform of the k-space data.

The contrast that is present in a magnetic resonance image is dependent on several physical properties of the nuclei that have been excited in order to obtain the MR data. The contrast that is present in an MR image is used to identify and characterize tissue properties that are shown in the image, ultimately for the purpose of diagnosing a pathological condition. Quantitative measurements in magnetic resonance imaging have recently gained much interest, such as calculation of the fat fraction (FF) and the transverse relaxation ($R_2^*$) from multi-gradient-echo images.

A typical way of determining quantitative parameters is to use a signal model, and to solve for the unknown model parameters, such as FF or $R_2^*$, given a series of measurements, e.g. multiple gradient-echo images.

It is typical that the signal model will contain constants that enter into the model. These constants can be associated with hardware of the magnetic resonance apparatus, such as receiver coil sensitivities, and those types of constants are typically measured in a calibration scan that takes place before the acquisition of the actual diagnostic MR data. The constants that enter into the signal model may also be given by the laws of physics, such as the Larmor frequency. Other constants that enter into the signal model are assumed to be known. An example of the latter category is the signal interference of water and triglycerides in the liver, which is typically determined once for each of a number of subjects, and then is assumed to be constant for all patients.

A general form of the signal model can be represented as $$s = \text{function of } (p,c,k)$$

wherein s is the vector of acquired signals, p is the vector of unknowns, c is the vector of constants, and k is the vector of assumed constants.

An important quality measure of the fitting process is the residual, which is a well-known quantity in the field of statistics and optimization. In general terms, the residual of an observed value is the difference between the observed value and the estimated function value. This can be generally represented as $$r = s - s' = s - \text{function of } (p0,c,k)$$

wherein p0 is the result of a fitting operation. From the residual and other variables, other, integral, measures for the quality of the fitting operation can be calculated, such as "chi squared," or "r squared" or the "rms error." These measures may be calculated inherently in the particular fitting algorithm used, and may constitute the "cost function" to be minimized.

Conventionally, the signal model constants in the third category are merely assumed to be known. As a consequence, any deviations from the true values of those constants lead to errors in the quantitative parameters to be determined. In some cases, the constants are reinterpreted as unknowns, and the relevant equation or equations are solved for these unknowns, along with the other unknowns. However, this is unfavorable since it makes the whole fitting operation less numerically stable, and the calculated quantitative parameters of interest more noisy.

An example of a signal model used in the context of chemical shift-based water/fat separation is described in the article "Chemical Shift-Based Water Fat Separation: A Comparison of Signal Models," Hernando et al., Magnetic Resonance in Medicine, Vol. 64 (2010), pp. 811-822. The evaluation of the consistency of different signal models, by generating a quantitative parameter map, is described in "Signal Model Consistency Analysis of Different Protocols and Spectral Models in Multi Gradient Echo Liver PDFF and $R_2^*$ Quantification," Bacher et al., Proceedings of the International Society of Magnetic Resonance in Medicine, $22^{nd}$ annual meeting (2014), p. 1672.

The parameters of the signal model correspond to, or correlate with, the measure or factor that is to be quantified. Examples are the apparent diffusion coefficient (ADC) as an exponential decay constant in a series of b-values, or transverse relaxation as another exponential decay constant in multi-echo acquisitions, or the fat/water signal modulation as interference constants in multi-echo acquisitions.

Additionally, there may be signal model parameters that describe confounding effects, such as inhomogeneity of the basic magnetic field (B0 inhomogeneity) in complex-valued signal fitting, or noise in magnitude-based signal fitting, or the temperature dependence of the water/fat spectrum. It has been proposed in the prior art that some of these parameters be used as variable parameters that are to be fitted as an additional degree of freedom, e.g. B0, or as precalibrated constants, e.g. noise or temperature.

In different signal model techniques, these additional parameters have either been included, or not included, in the signal model. Confounding factors or additional model parameters have been proposed for inclusion individually, and studies have been made to characterize the performance of these model variants, for example, their accuracy with respect to a reference standard. In quantitative fat/water/relaxation MR measurements, multi-step approaches are known as described, for example, in United States Patent Application Publication No. 2014/0128785, and the use of a spectral model of a multipoint Dixon technique is described in United States Patent Application Publication No. 2015/0061672. The disclosures of United States Patent Application Publication No. 2014/0126795 and United States Patent Application Publication No. 2015/0061672 are incorporated herein by reference.

U.S. Pat. No. 5,378,987 describes temperature measurements based on chemical shift, by analyzing a phase difference map.

Additionally, region of interest (ROI) analysis is known, but typically is used only manually and retrospectively, for parameter evaluation.

SUMMARY OF THE INVENTION

An object of the present invention is to provide a magnetic resonance apparatus and method wherein the quality of fit of a signal model that is employed in order to generate a quantitative parameter map can be evaluated in a visual presentation.

In accordance with the invention, this object is achieved in a magnetic resonance method and apparatus wherein the MR apparatus is operated to acquire MR data, and a quantitative parameter map is generated from the acquired MR data, using a signal fitting with multiple signal models containing different combinations of free and fixed parameters. A tentative signal fitting is made for each signal model, with each signal fitting resulting in a quality parameter such as the aforementioned "chi squared" or "r squared." This quality parameter describes the goodness of fit of this signal model variant. A multitude of additional parameters thus can be pre-tested with regard to their influence on the model fit. Examples are physical effects such as noise, temperature, composition of the water/fat spectrum, etc. Moreover, unspecified, empirical parameters can be tested, that enter into the signal model in an additive, multiplicative, exponential or other functional manner.

Additionally, an ROI analysis can be performed inline for any preliminary fit of a tentative signal model, for example through the inline ROI functionality of the abdomen Dot engine extensions in the commercially available software syngo MR E11A. Parameters that are known to have, or are suspected to have, a slow-varying spatial distribution, or otherwise near-constant or known dependence between pixels, can be averaged over the relevant ROI, and either updated as fixed parameters or transformed from free to fixed parameters. The assumption of spatial distribution can be verified by a goodness-of-fit analysis of the individual pixels, or groups of pixels. Different ROIs can be used both to analyze the distribution of parameters among individual pixels, or to average the original data initially, followed by performance of an individual tentative parameter fit.

An example is in the case of fat/water/relaxation MR measurements, wherein a preliminary fit is made followed by an ROI evaluation, using a signal model containing a noise level, and temperature, as free parameters, and then determining and optimizing the model via the goodness-of-fit analysis. These parameters are then fixed for the final quantitative fitting procedure.

An example of a suitable goodness-of-fit analysis is described in co-pending U.S. application Ser. No. 14/644,583, the disclosure of which is incorporated herein by reference: As described therein, a residual of the quantitative parameter map is calculated and, from the calculated residual, a residual map is generated. The residual map is displayed together with the quantitative parameter map, with the residual map serving as an indicator of the quality of fit of the signal model.

The parameter map is generated for each tentative signal model. If desired, during each goodness-of-fit analysis for each tentative signal model, the parameter map generated from that signal model can be displayed together with a residual map. Alternatively, the testing of the tentative models can proceed within a computer or processor in an iterative manner from model-to-model, with only the final model then being used to generate a parameter map that is displayed, either by itself or with the associated residual map.

The residual map is thus itself a parameter map, with the residual, or a value derived from the residual, being used to generate the residual map. If the residual itself is not used to generate the parameter map, the value derived therefrom that is used to generate the parameter map can be, for example, small r squared or chi squared.

For example, in the case of a fat spectral model for the liver of a patient, if the residual map indicates that the signal model fit is not good, it may be deduced that the fat composition of the particular liver tissue in question is not what it was assumed to be when the signal model was created. A modification in the signal model can then be made, and another residual map can be generated. This procedure can be iteratively repeated until an acceptable fit of the signal model is achieved.

DESCRIPTION OF THE PREFERRED EMBODIMENTS

Figure 1:
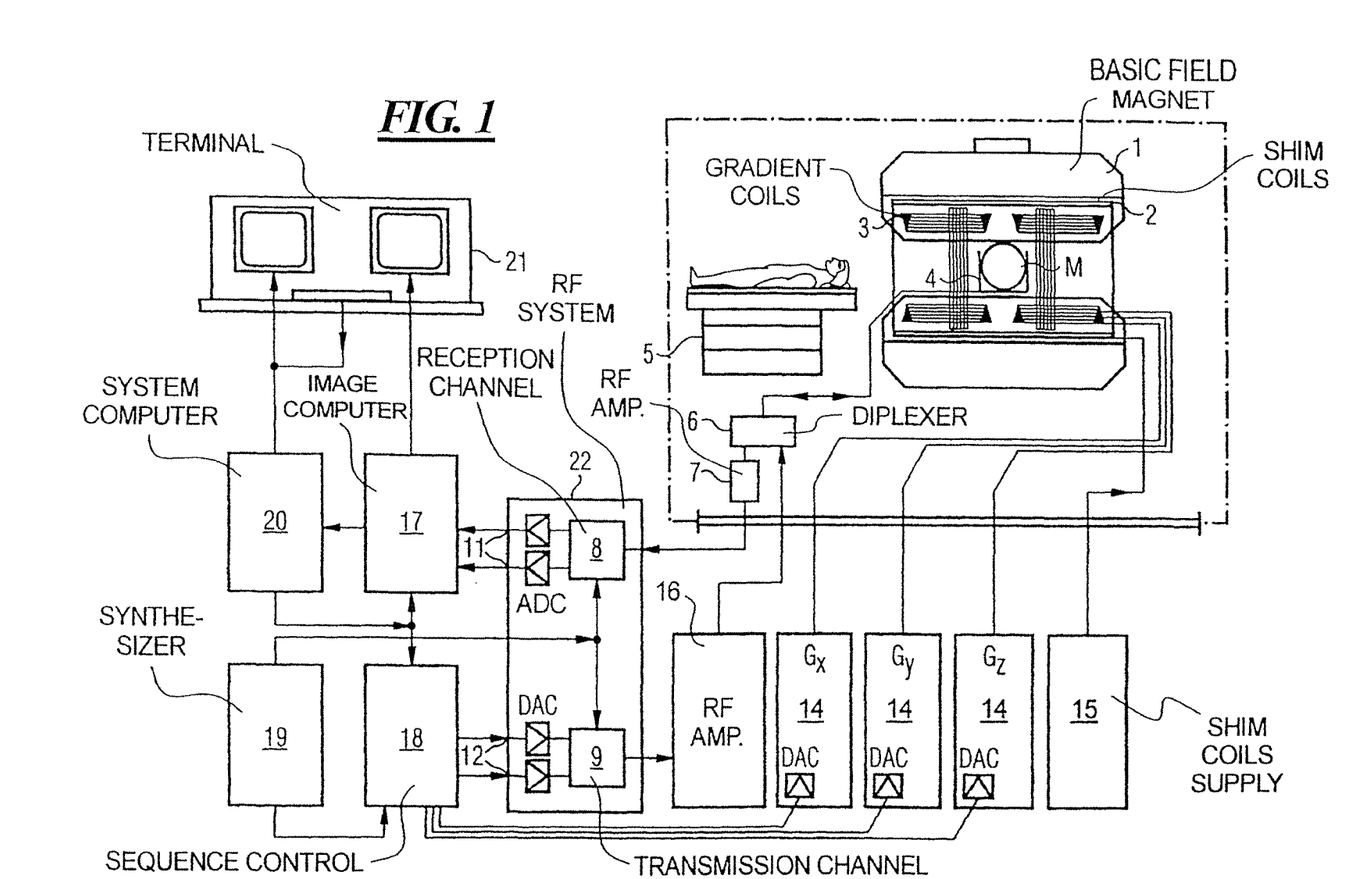
FIG. 1 schematically illustrates a magnetic resonance apparatus that can be operated in accordance with the present invention.

FIG. 1 is a schematic representation of a magnetic resonance system (a magnetic resonance imaging or magnetic resonance tomography apparatus). A basic field magnet 1 generates a temporally constant, strong magnetic field for polarization or alignment of the nuclear spins in a selected region O of an examination subject U, for example of a part of a human body that is to be examined. The body lies on a table 23 and is examined in the magnetic resonance system 5. The high homogeneity of the basic magnetic field that is required for the magnetic resonance measurement (data acquisition) is defined in a typically (but not necessarily) spherical measurement volume M into which the parts of the human body that are to be examined are introduced. Shim plates made of ferromagnetic material are attached at suitable points to assist the homogeneity requirements, and in particular to eliminate temporally invariable influences. Temporally variable influences are eliminated by shim coils 2 operated by a shim coils amplifier 27.

A cylindrical gradient coil system 3 composed of three sub-windings is used in the basic field magnet 1. Each sub-winding is supplied with current by an amplifier to generate, for example, a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_x$ in the z-direction. The amplifier comprises a digital/analog converter which is activated by a sequence controller 18 for accurately-timed generation of gradient pulses.

Located within the gradient field system 3 are one (or more) radio-frequency antennas 4—in particular at least one multichannel RF transmission coil and at least one RF reception coil—that convert the radio-frequency pulses emitted by a radio-frequency power amplifier 28 into an alternating magnetic field for excitation of the nuclei and alignment of the nuclear spins of the examination subject U to be examined, or of the region of the selected region O of the examination subject U that is to be examined. Each radio-frequency antenna 4 is composed of one or more RF transmission coils and multiple RF reception coils in the form of an annular—preferably linear or matrix-like—arrangement of component coils. The alternating field emanating from the precessing nuclear spins—i.e. normally the spin echo signals caused by a pulse sequence composed of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of nuclear magnetic resonance. The respective radio-frequency pulses are digitally represented in the sequence controller 18 as a series of complex numbers based on a pulse sequence predetermined by the system computer 20, which has a computer 24 to determine flip angles adapted to a predetermined signal curve. This number sequence is supplied as a real part and an imaginary part to a digital/analog converter in the radio-frequency system 22 via respective inputs 12, and from said digital/analog converter to the transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. An MR image or three-dimensional image data set can be reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals.

The time base for the radio-frequency system 22 and the sequence controller 18 is provided by a synthesizer 19. The selection of corresponding control programs to generate an acquisition of magnetic resonance data (which programs are stored on a DVD 21, for example), the selection of a selected region O that should be excited and from which magnetic resonance data should be received, the specification of a substance with which the selected region O is filled to determine the flip angles for the desired signal curve, and the presentation of a generated MR image take place via a terminal 13 (for example) that has a keyboard 15, a mouse 16 and a monitor 14.

Figure 2:
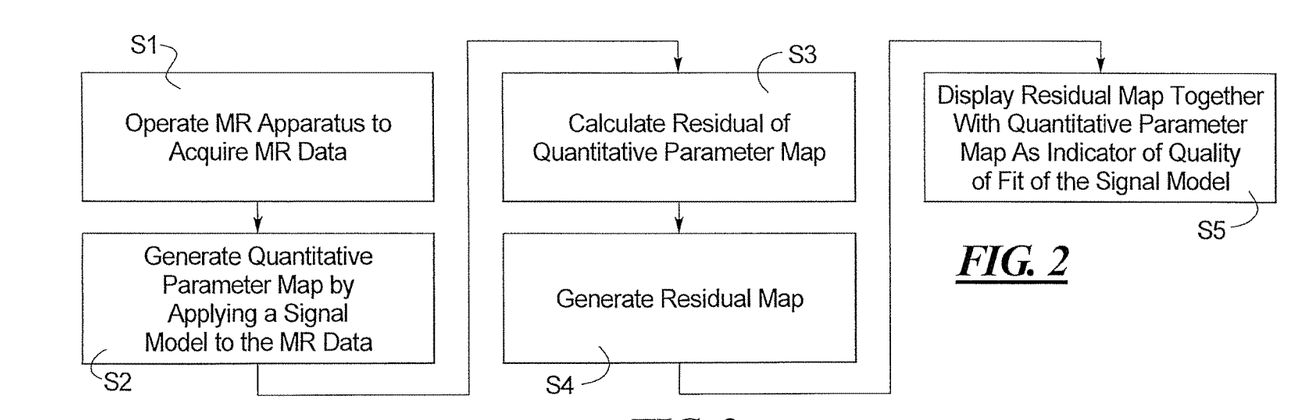
FIG. 2 is a flowchart of the basic steps of the method as described in co-pending U.S. application Ser. No. 14/644,583.

FIG. 2 is a flowchart showing the basic steps of the method described in co-pending U.S. application Ser. No. 14/644,583.

In step S1, the MR apparatus shown in FIG. 1 is operated in order to acquire MR data from a subject. For this purpose, the MR apparatus shown in FIG. 1 may be operated according to a multi-echo gradient echo sequence, for example.

From the acquired MR data, a quantitative parameter map is generated in step S2, by applying a signal model to the MR data. The signal model is of the type described above, which is based on a number of factors that have been selected in the creation of the signal model, either based on pre-diagnostic scan measurements, or based on assumed values. The quality of fit of the signal model is dependent on the extent to which these selected constants correctly correspond to the real values thereof that are dependent on the hardware and operating parameters of the MR apparatus, as well as on the examination subject.

In step S3, a residual of the quantitative parameter map is calculated and, in step S4, a residual map is generated from the calculated residual.

In step S5, the residual map is displayed together with the quantitative parameter map. The residual map serves as an indicator of the quality of fit of the signal model.

Figure 3:
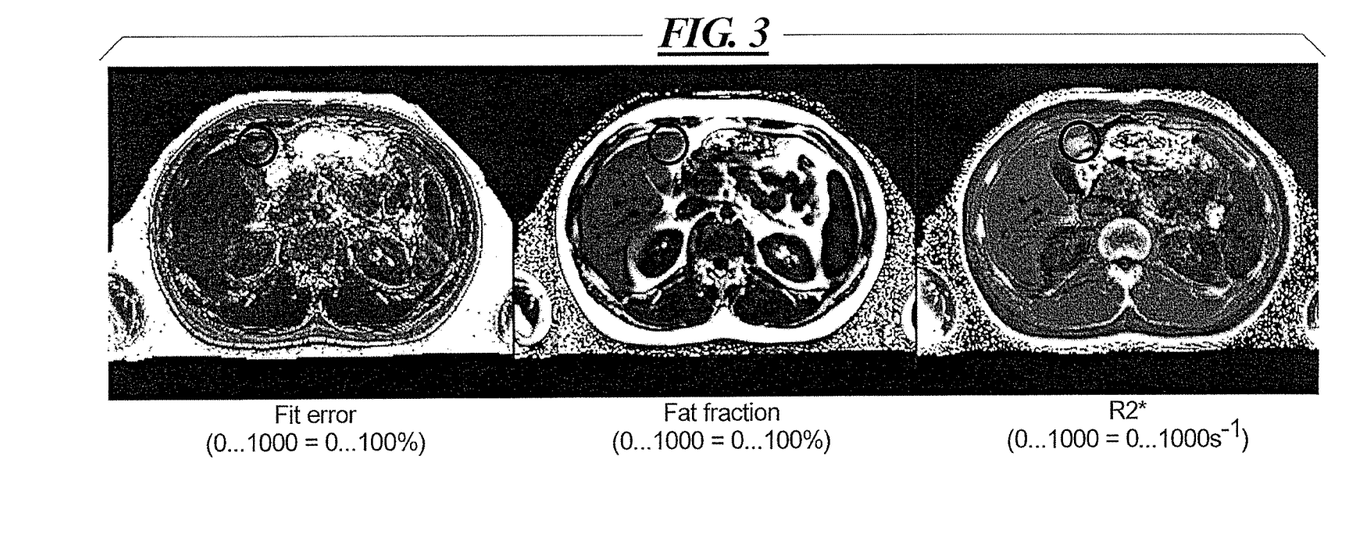
FIG. 3 illustrates an example of residual maps generated as described in co-pending U.S. application Ser. No. 14/644,583.

Examples of signal maps obtained in accordance with the technique described in co-pending application Ser. No. 14/644,583 are shown in FIG. 3. It can be seen that the marked (circled) region in the left liver lobe stands out from the consistency metric map (residual map). In this case, the fit error is expressed as a percentage of the grayscale range, which is between 0 and 1,000, and thus the fit error has a value in a range between 0 and 100 percent.

A conventional fat fraction map is shown in the center of FIG. 3, therein it can be seen at the same region is not as readily apparent. The figure at the right in FIG. 3 is a transverse relaxation map, wherein it can be seen that the marked region exhibits and elevated transverse relaxation.

In this case, the elevated fit error originates most likely not from a pathology, but from a homogeneity in the basic magnetic field, which may also be a source of the detected signals not being in accordance with the signal model. A similar appearance can be expected, however, if the tissue type does not match the signal model, for example, because the fat composition is different from that which would be expected in the liver from a patient population whose statistics are used to generate the model.

In order to illustrate the efficacy of the method described in co-pending application Ser. No. 14/644,583 in the absence of available clinical data acquired from patients, a simulation study was implemented making use of nine "tube phantoms." In the simulation study shown in FIG. 4, all nine phantoms were the same, and in the study shown in FIG. 5, the center phantom had a slightly different fat composition. The fat signal of the center phantom in FIG. 5 was simulated using the fat spectral model described by Ren et al in Journal of Lipid Research, whereas the other phantoms in FIG. 5, and all of the phantoms in FIG. 4, use the fat spectral model described by Hamilton et al. in NMR Biomedicine. Both types of fat signal model are derived from measured fat spectra, and both are used as model parameters in the literature.

Figure 4:
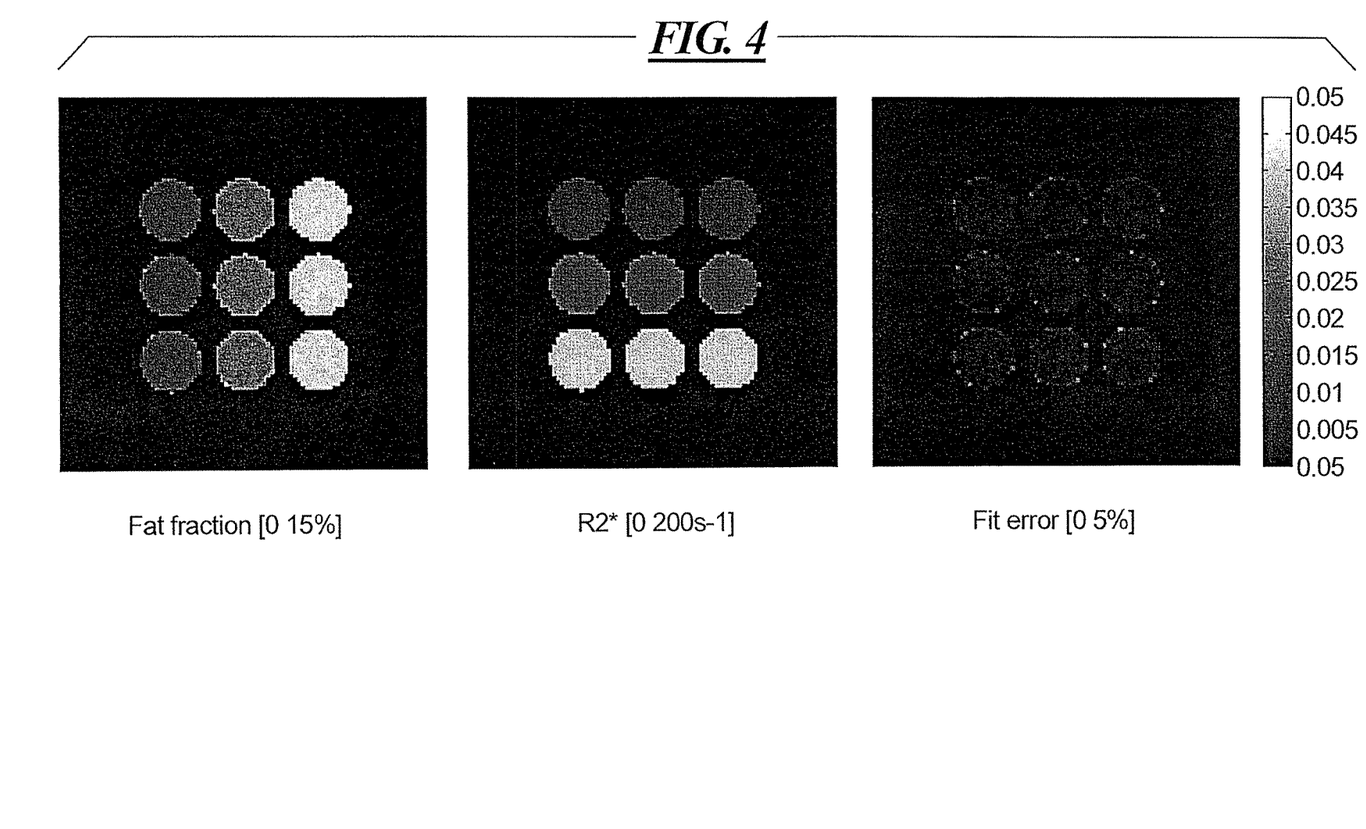
FIG. 4 shows images produced by the method as described in co-pending U.S. application Ser. No. 14/644,583.
Figure 5:
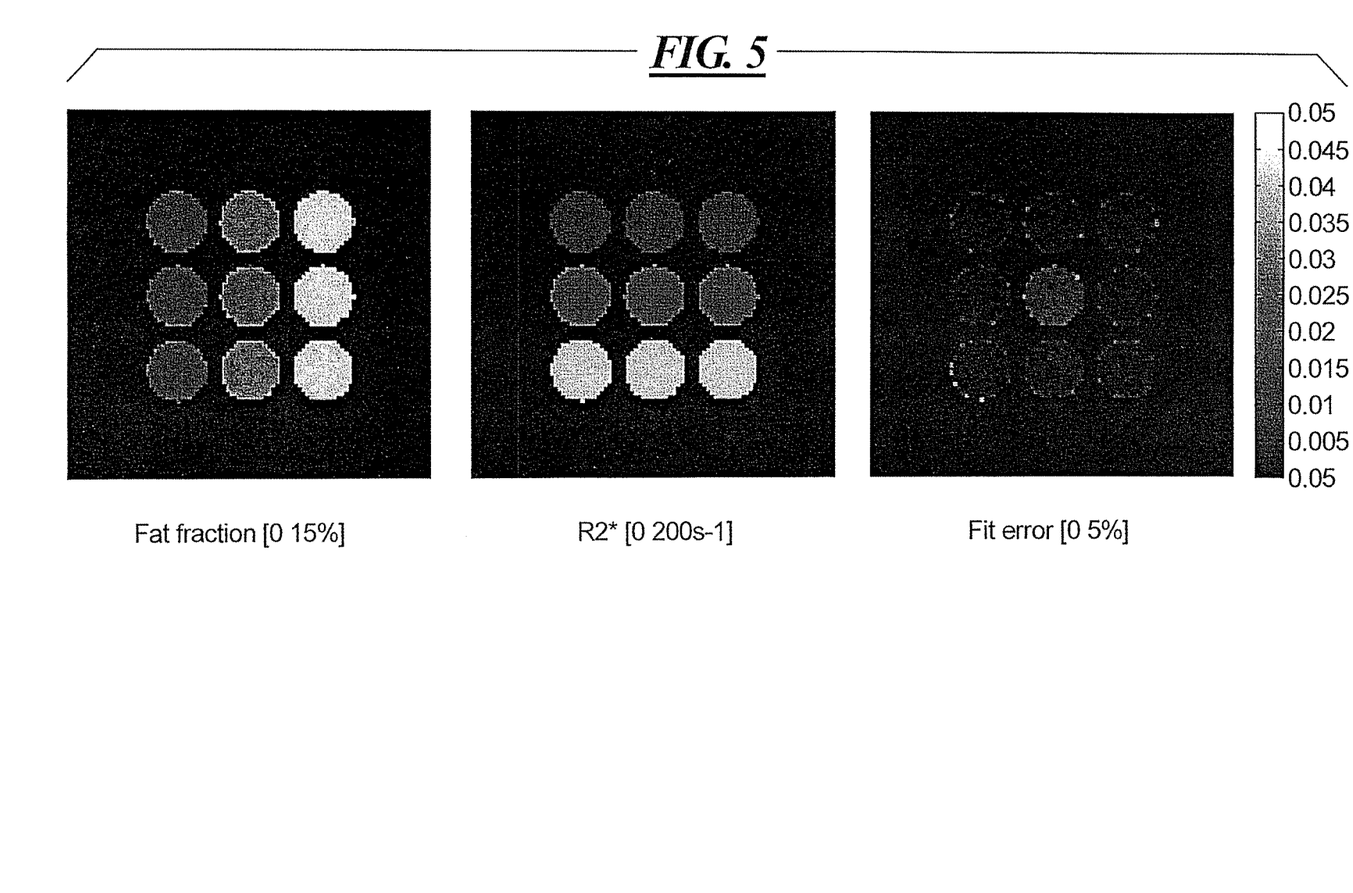
FIG. 5 shows images produced by the method as described in co-pending U.S. application Ser. No. 14/644,583.

In each of FIGS. 4 and 5, a pixel-by-pixel parameter estimation was made from synthetic raw data, in order to generate a fat fraction map shown at the left of each figure, and R2* map as shown in the center of each figure, and a fit error map in accordance with the inventive method, shown at the right of each of FIGS. 4 and 5.

FIG. 4 shows no fat model mismatch, in view of the fact that all of the nine phantoms are the same. FIG. 5 illustrates a fat model mismatch, with the center phantom, as noted above, having a slightly different fat composition. This difference is barely visible in either the fat fraction map or the R2* map shown in FIG. 5, but is clearly visible in the fit error map shown in FIG. 5.

The above-described goodness-of-fit analysis can be used in accordance with the present invention to analyze multiple tentative signal models, that each embody parameters or factors that can be selected dependent on the ultimate purpose or goal of the diagnosis that is to be made in the clinical MR image.

Figure 6:
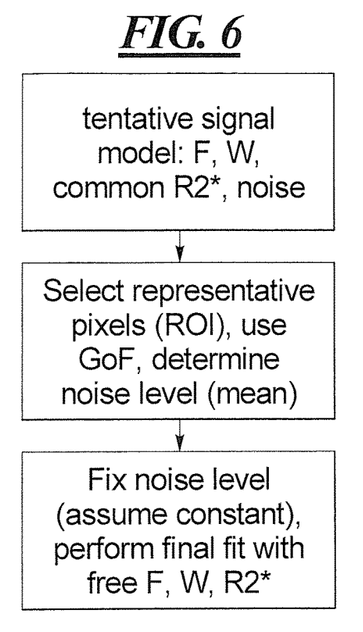
FIG. 6 is a flowchart of a first embodiment for analyzing a tentative signal model in accordance with the present invention.

FIG. 6 shows an example using a tentative signal model embodying F, W, common R2*, and noise, as indicated in the initial block in FIG. 6. An ROI analysis is then performed using selected representative pixels and GoF, and a noise level is determined, which can be the mean noise level.

As shown in the last block of FIG. 6, the determined noise level is then fixed as an assumed constant in the model, and a final fit is performed with free F, W and R2*.

Figure 7:
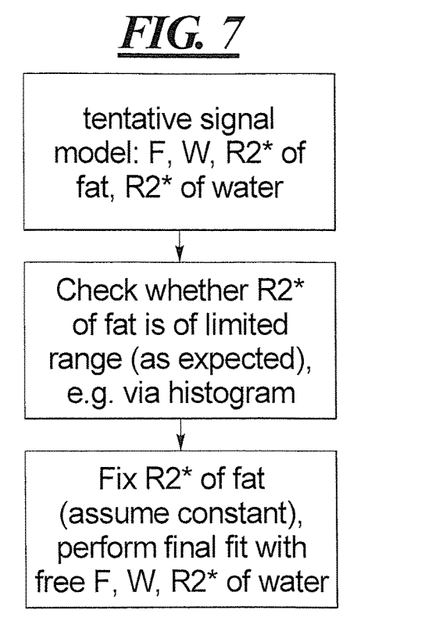
FIG. 7 is a flowchart of a second embodiment for analyzing a tentative signal model in accordance with the present invention.

In the example shown in FIG. 7, as indicated in the first block thereof, the tentative signal model uses F, W, R2* of fat, and R2* of water. As indicated in the second block of FIG. 7, this tentative model is analyzed to check whether R2* of fat is of a limited range, as would be expected to be the case. This checking can be done, for example, using a histogram.

As indicated in the third block of FIG. 7, if R2* of fat is of a limited range, it can then be fixed as an assumed constant in the model, and a final fit can then be performed with F, W, and R2* of water.

Figure 8:
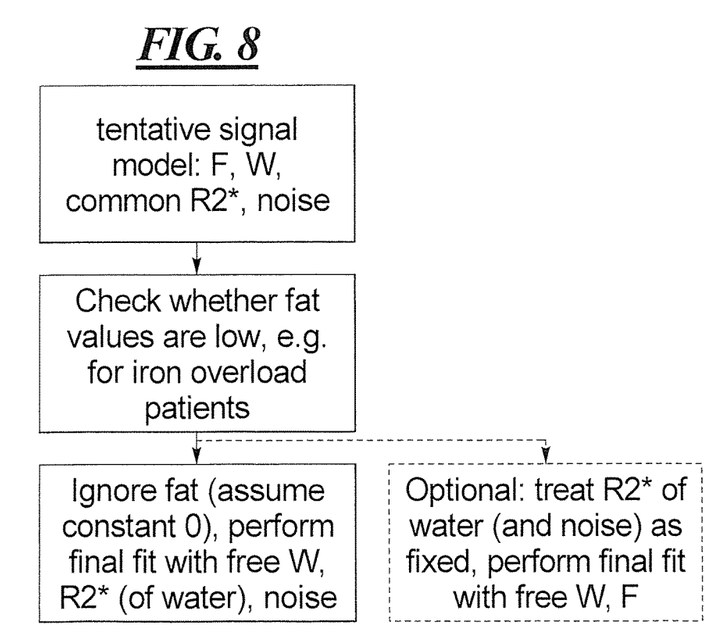
FIG. 8 is a flowchart of a third embodiment for analyzing a tentative signal model in accordance with the present invention, also showing an optional step.

In the example shown in FIG. 8, the tentative signal model again uses F, W, common R2*, and noise, as indicated in the first block thereof. In the example of FIG. 8, it is then checked whether the fat values are low, as may be the case, for example, for patients having an iron excess.

As indicated in the third block of FIG. 8, if it is determined that the fat values are low, fat can be ignored in the final fit, i.e., it is assumed to be a constant with a value of 0. The final fit is then performed with free W, R2* of water, and noise.

As also indicated in the example of FIG. 8 by the dashed lines, an optional step is to treat R2* of water, and the noise, as fixed, and to perform the final fit with free W, F.

As noted above, the goodness-of-fit analysis for each of these tentative models can be performed as described above, according to the technique described in co-pending application Ser. No. 14/644,583. The results of each fitting can be displayed as described above, with the parameter map and the residual map together. It is also possible to perform all of the fitting of the tentative models and the goodness-of-fit analysis for each model within a computer or processor, without displaying the results for each tentative model, and then to only display the parameter map that is finally determined, either by itself or with the associated residual map.

Although modifications and changes may be suggested by those skilled in the art, it is the intention of the inventor to embody within the patent warranted hereon all changes and modifications as reasonably and properly come within the scope of their contribution to the art.

We claim as our invention:

1. A method for operating a magnetic resonance (MR) apparatus, comprising:
   operating the MR apparatus, a subject is situated therein, to acquire MR data from the subject;
   providing the acquired MR data to a computer and, in said computer, generating a plurality of quantitative parameter maps each representing multiple parameters having an effect on said MR data, each quantitative parameter map being generated by applying a respective tentative signal model, from a plurality of signal models, to the MR data;
   in said computer, for each tentative signal model, performing an initial analysis to determine whether any of said parameters can be set to at least a locally constant value and, if so, setting respective parameters to respective locally constant values, so as to produce an initially analyzed tentative model from each tentative signal model, and thereby producing a plurality of initially analyzed tentative signal models;
   in said computer, performing at least a quality of fit analysis of each initially analyzed tentative signal model;
   in said computer, selecting, as a final signal model, a tentative signal model, among said plurality of tentative signal models, for which said quality of fit analysis, for the initially analyzed tentative fit model produced therefrom, is best; and
   generating a parameter map using said tentative signal model for which said quality of fit is best, and displaying that parameter map at a display monitor in communication with said computer.

2. The method as claimed in claim 1 comprising performing said initial analysis as a region of interest analysis.

3. The method as claimed in claim 1 comprising performing said quality of fit analysis by, in said computer, calculating a residual of the fit of the respective initially analyzed tentative signal model and the MR data.

4. The method as claimed in claim 3 comprising generating a map of the quality of fit from the calculated residual, and displaying said parameter map produced from the tentative signal model having the best quality of fit together with the map of the quality of fit from the residual calculated from that tentative signal model.

5. The method as claimed in claim 1 comprising using, as one of said tentative signal models, a selected tentative signal model comprising a fat signal F, a water signal W, common transverse magnetization R2* and noise, applying a region of interest analysis as said initial analysis to determine a level of said noise, fixing said noise level as a constant in said selected tentative model, and performing said quality of fit analysis for the initially analyzed tentative signal model produced from said selected tentative signal model, with said noise level as a constant and with free F, W and R2*.

6. The method as claimed in claim 1 comprising using, as one of said tentative signal models, a selected tentative signal model comprising a fat signal F, a water signal W, transverse magnetization R2* of fat, and transverse magnetization R2* of water, determining whether said R2* of fat is in a limited range and, if so, fixing R2* of fat as a constant in said selected tentative model, and performing said quality of fit analysis with said selected tentative signal model with R2* of fat fixed as a constant and free F, W and R2* of water.

7. The method as claimed in claim 1 comprising using, as one of said tentative signal models, a selected tentative signal model comprising a fat signal F, a water signal W, transverse magnetization R2* of water and noise, determining whether fat values are below a predetermined level and, if so, setting F to be a constant of 0, and performing said goodness of fit analysis for said selected tentative signal model with F=0 and with free W, R2* of water, and noise.

8. The method as claimed in claim 1 comprising using, as one of said tentative signal models, a selected signal model comprising a fat signal F, a water signal W, transverse magnetization R2* of water and noise, determining whether fat values are below a predetermined level and, if so, treating R2* of water as a fixed constant and treating noise as a fixed constant, and said goodness-of-fit analysis for said selected tentative signal model with R2* of water as a fixed constant and noise as another fixed constant, and with free W and F.

9. A magnetic resonance apparatus comprising
a magnetic resonance scanner configured to receive an examination subject therein;
a control and analysis computer configured to operate said MR scanner with said examination subject therein, to acquire MR data from the examination subject;
said control and analysis computer being provided with the acquired MR data, and said control and analysis computer being configured to generate a plurality of quantitative parameter maps each representing multiple parameters having an effect on said MR data, each quantitative parameter map being generated by applying a respective tentative signal model, from a plurality of signal models, to the MR data;
said control and analysis computer, for each tentative signal model, being configured to perform an initial analysis to determine whether any of said parameters can be set to at least a locally constant value and, if so, setting respective parameters to respective locally constant values, so as to produce an initially analyzed tentative model from each tentative signal model, and thereby producing a plurality of initially analyzed tentative signal models;
said control and analysis computer being configured to perform at least a quality of fit analysis of the initially analyzed tentative signal model;
said control and analysis computer being configured to select, as a final signal model, a tentative signal model, among said plurality of tentative signal models, for which said quality of fit analysis, for the initially analyzed tentative fit model produced therefrom, is best; and
said control and analysis computer being configured to generate a parameter map using said tentative signal model for which said quality of fit is best, and to display that parameter map at a display monitor in communication with said control and analysis computer.

10. A non-transitory computer-readable data storage medium encoded with programming instructions, said storage medium being loaded into a control and processing computer of a magnetic resonance (MR) apparatus, said programming instructions causing said control and analysis computer to:
operate the MR apparatus, in which a subject is situated, to acquire MR data from the subject;
generate a plurality of quantitative parameter maps each representing multiple parameters having an effect on said MR data, each quantitative parameter map being generated by applying a respective tentative signal model, from a plurality of signal models, to the MR data;
for each tentative signal model, perform an initial analysis to determine whether any of said parameters can be set to at least a locally constant value and, if so, setting respective parameters to respective locally constant values, so as to produce an initially analyzed tentative model from each tentative signal model, and thereby producing a plurality of initially analyzed tentative signal models;
perform at least a quality of fit analysis of the initially analyzed tentative signal model;
select, as a final signal model, a tentative signal model, among said plurality of tentative signal models, for which said quality of fit analysis, for the initially analyzed tentative fit model produced therefrom, is best; and
generate a parameter map using said tentative signal model for which said quality of fit is best, and display that parameter map at a display monitor.

* * * * *